(12) United States Patent
Tsui et al.

(10) Patent No.: US 6,971,793 B2
(45) Date of Patent: Dec. 6, 2005

(54) TEST HANDLER TEMPERATURE MONITORING SYSTEM

(75) Inventors: Ching Man Stanley Tsui, Kwai Chung (CN); Sai Kit Wong, Kwai Chung (CN); Shing Kai Yip, Kwai Chung (CN)

(73) Assignee: ASM Assembly Automation Ltd., Hong Kong (HK)

( * ) Notice: Subject to any disclaimer, the term of this patent is extended or adjusted under 35 U.S.C. 154(b) by 0 days.

(21) Appl. No.: 10/395,401

(22) Filed: Mar. 21, 2003

(65) Prior Publication Data

US 2004/0184508 A1    Sep. 23, 2004

(51) Int. Cl.[7] .............................. G01J 5/00
(52) U.S. Cl. ............... 374/121; 374/130; 374/132; 324/158.1
(58) Field of Search ................ 374/121, 132, 374/133, 141, 182, 131, 208, 125, 130, 5, 374/57; 324/158.1; 702/118, 134, 135

(56) References Cited

U.S. PATENT DOCUMENTS

| | | | | |
|---|---|---|---|---|
| 4,831,258 A | * | 5/1989 | Paulk et al. ............... | 250/349 |
| 4,867,574 A | * | 9/1989 | Jenkofsky .................. | 374/121 |
| 5,143,450 A | * | 9/1992 | Smith et al. ................ | 374/12 |
| 5,172,049 A | * | 12/1992 | Kiyokawa et al. .......... | 324/760 |
| 5,249,142 A | * | 9/1993 | Shirakawa et al. ......... | 702/135 |
| 5,713,666 A | * | 2/1998 | Seelin et al. ............... | 374/126 |
| 5,801,527 A | * | 9/1998 | Ishii et al. ................. | 324/158.1 |
| 5,841,110 A | * | 11/1998 | Nenyei et al. .............. | 219/497 |
| 5,969,537 A | * | 10/1999 | Kanno et al. .............. | 324/760 |
| 6,099,597 A | * | 8/2000 | Yap et al. .................. | 324/760 |
| 6,168,311 B1 | * | 1/2001 | Xiao et al. ................. | 374/161 |
| 6,190,037 B1 | * | 2/2001 | Das et al. .................. | 374/121 |
| 6,259,247 B1 | * | 7/2001 | Bannai ..................... | 324/158.1 |
| 6,362,640 B1 | * | 3/2002 | Wee .......................... | 324/760 |
| 6,375,348 B1 | * | 4/2002 | Hebb et al. ................. | 374/9 |
| 6,440,772 B1 | * | 8/2002 | Smith ........................ | 438/106 |
| 6,445,203 B1 | * | 9/2002 | Yamashita et al. ......... | 324/760 |
| 6,507,206 B1 | * | 1/2003 | Vesaruch et al. ........... | 324/760 |
| 6,518,745 B2 | * | 2/2003 | Kim et al. ................. | 324/158.1 |
| 6,593,761 B1 | * | 7/2003 | Fukasawa et al. .......... | 324/754 |
| 6,647,350 B1 | * | 11/2003 | Palfenier et al. ............ | 702/134 |
| 6,676,289 B2 | * | 1/2004 | Hirano et al. .............. | 374/141 |
| 2002/0047702 A1 | * | 4/2002 | Stone ....................... | 324/158.1 |
| 2002/0109518 A1 | * | 8/2002 | Saito et al. ................ | 324/760 |
| 2003/0020457 A1 | * | 1/2003 | Seng et al. ................ | 324/158.1 |

* cited by examiner

*Primary Examiner*—Gail Verbitsky
*Assistant Examiner*—Mirellys Jagan
(74) *Attorney, Agent, or Firm*—Ostrolenk, Faber, Gerb & Soffen, LLP

(57) ABSTRACT

The invention provides a temperature monitoring system for a semiconductor test handler. A preparation stage brings a test device to a predetermined temperature for testing at a test platform at said predetermined temperature. At least one radiation sensor, such as a thermopile device, is employed in the test handler for detecting a surface temperature of the test device by measuring radiation emitted from the test device.

35 Claims, 5 Drawing Sheets

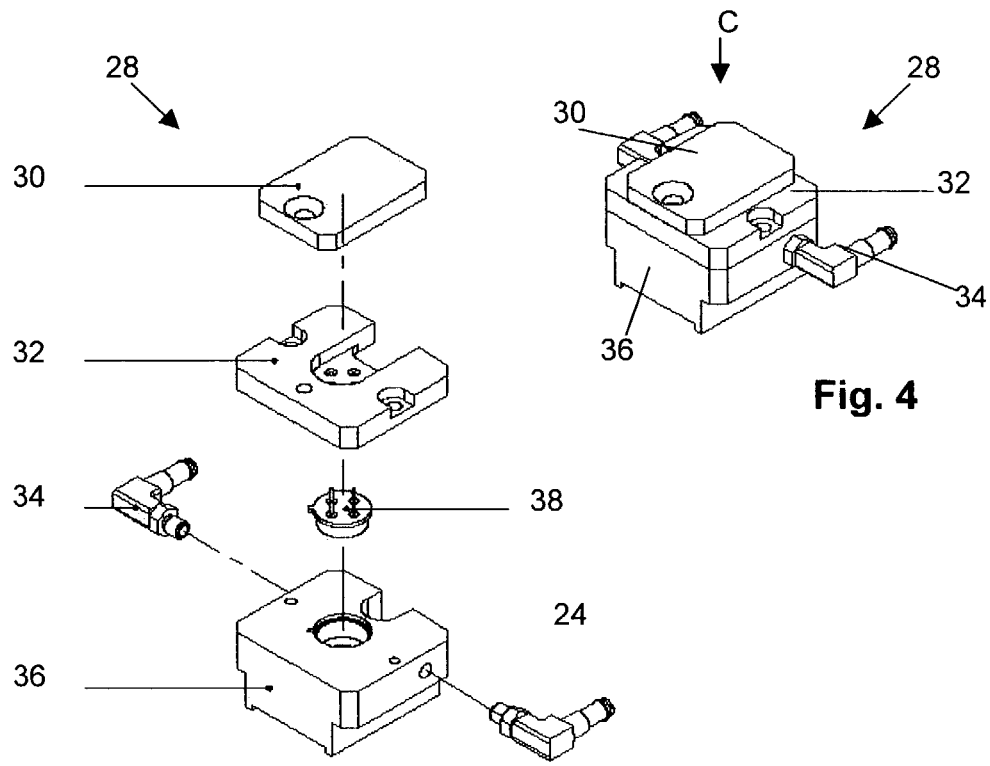
Fig. 4
Fig. 7
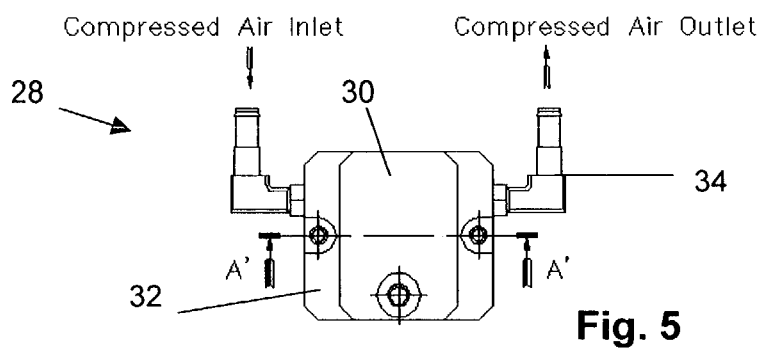
Fig. 5
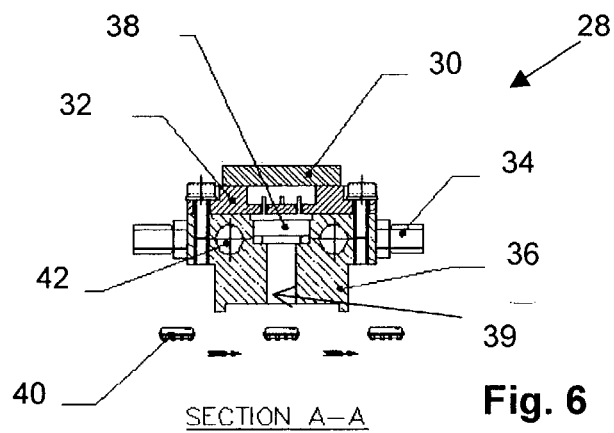
Fig. 6

TEST HANDLER TEMPERATURE MONITORING SYSTEM

FIELD OF THE INVENTION

The invention relates to a method and apparatus for measuring surface temperature of electronic devices while they are undergoing a test handling process in a semiconductor test handler. More specifically, the apparatus is equipped with temperature sensors to monitor the temperature of the electronic devices as they are prepared for electrical testing.

BACKGROUND AND PRIOR ART

During the manufacture of some electronic devices, in particular, integrated circuit packages in the semiconductor industry, it is necessary for the devices to be electrically tested after the packages have been molded. Normally, the devices are tested only after they have been brought to a certain predetermined temperature by heating or cooling. This predetermined temperature usually reflects the expected operating environments for the devices being tested. A typical testing temperature is about 90–100° C., but different testing temperatures may be selected depending on the type of device being tested. The following description shall focus on heating the electronic devices before electrical testing, although it should be appreciated that the invention is equally applicable to the cooling of electronic devices before testing.

Various testing devices have been developed to perform such electrical tests. For example, test handlers have been developed in the integrated circuit packaging industry to perform final electrical tests on electronic devices automatically at high speeds. Test handlers feed electronic devices to and away from a test platform at desired rates of speed. These test handlers usually include heating chamber(s) within which the electronic devices to be tested are first soaked to the specified test temperature before they are tested on the test platform.

When the electronic devices are passing through the heating chambers, their temperatures need to be constantly monitored so that gradual heating of the devices can be attained without subjecting them to excessive thermal stress or damaging them. Temperature sensors are commonly used for such temperature measurements. Examples are contact-type thermocouples and resistive temperature devices (RTD). However, the ability of test handlers that employ these types of sensors to detect a temperature of a moving test device inside the test handler is limited.

Instead of directly measuring the surface temperature of test devices, such temperature sensors measure the temperature of the heat transfer media, usually forced heated air or a metal holder. Prior to this, a temperature sensor embedded in a test device is used to record the true device temperature and to calibrate the sensor readings. Furthermore, when using a single temperature sensor inside a large volume of a thermally controlled chamber, a temperature reading of the sensor over the heating chamber will vary with different airflows according to chamber geometry. Sensors located at the edges of the chamber encounter lower flow rates whereas sensors located at the center encounter higher flow rates. This means that the sensor readings cannot accurately represent the surface temperature. This becomes significant when a carrier for the test device has a relatively high heat loss or has its own temperature distribution.

Using non-contact type sensing on a test handler would allow probing without affecting the temperature of the test device, especially when the test device is small. It allows the test handler to handle different types of test devices without any major design change in the system.

Moreover, soak time is becoming shorter and temperature sensors with faster response times are required. Whilst typical contacting sensors have response times that are more than a few seconds, radiation sensors such as thermopile sensors can complete a measurement within one second. Furthermore, by not locating the temperature sensor inside the thermally conditioned chamber, this subjects lesser thermal stress on the sensor and reduces machine down-time. Thus, a contactless method for sensing a temperature of a test device is desirable. Radiation sensors are especially suitable where the test device contains a plastic molding which provides a consistent and large emissivity.

SUMMARY OF THE INVENTION

Therefore, the invention seeks to provide a temperature sensor which senses temperature by detecting heat that is radiated from a test device to thereby avoid some of the disadvantages associated with prior art contact-type sensors.

According to a first aspect of the invention, there is provided a temperature monitoring system for a test handler comprising a preparation stage for bringing a test device to a predetermined temperature; a test platform for testing the test device at said predetermined temperature; and at least one radiation sensor adapted for detecting a surface temperature of the test device by measuring radiation emitted from the test device.

According to a second aspect of the invention, there is provided a method for monitoring temperature in a test handler comprising the steps of bringing a test device to a predetermined temperature while providing at least one radiation sensor to detect a surface temperature of the test device by measuring radiation emitted from the test device; and testing the test device at said predetermined temperature.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

FIG. 4 is an isometric view of a thermopile sensor according to the preferred embodiment of the invention;

FIG. 5 is a top view of the thermopile sensor from direction C of FIG. 4;

FIG. 6 is a cross-sectional view of the thermopile sensor along section A—A of FIG. 5;

FIG. 7 is an exploded view of the thermopile sensor of FIG. 4; and

DETAILED DESCRIPTION OF THE PREFERRED EMBODIMENT

Figure 1:
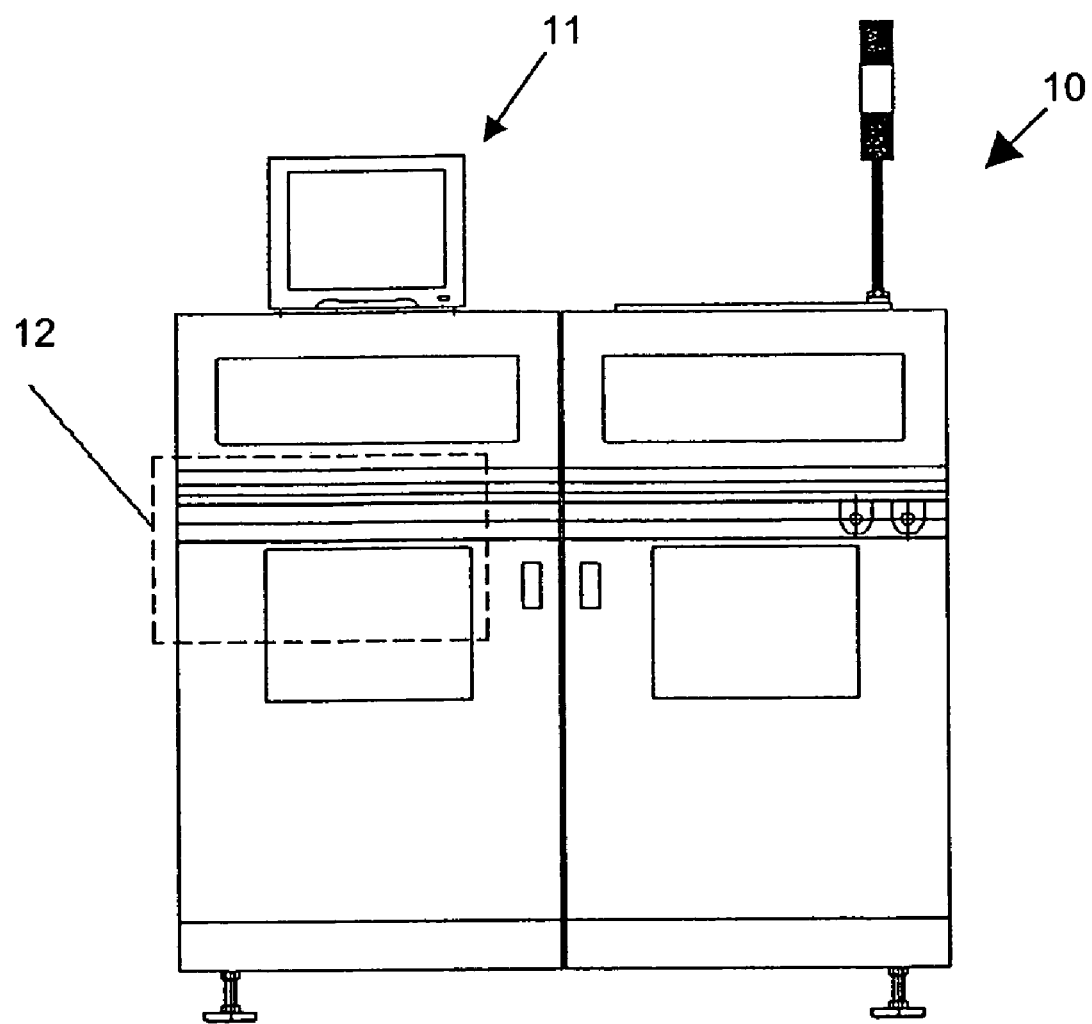
FIG. 1 is a front view of a typical test handler machine.

FIG. 1 is a front view of a typical test handler machine 10. The test handler machine 10 may include a display screen 11 to view in real time process parameters associated with the test handling process, as well as to facilitate a user to set process parameters such as heating temperatures. The test handler machine 10 has a preparation stage, which may be in the form of a preheat location 12, where test devices are heated prior to testing.

Figure 2:
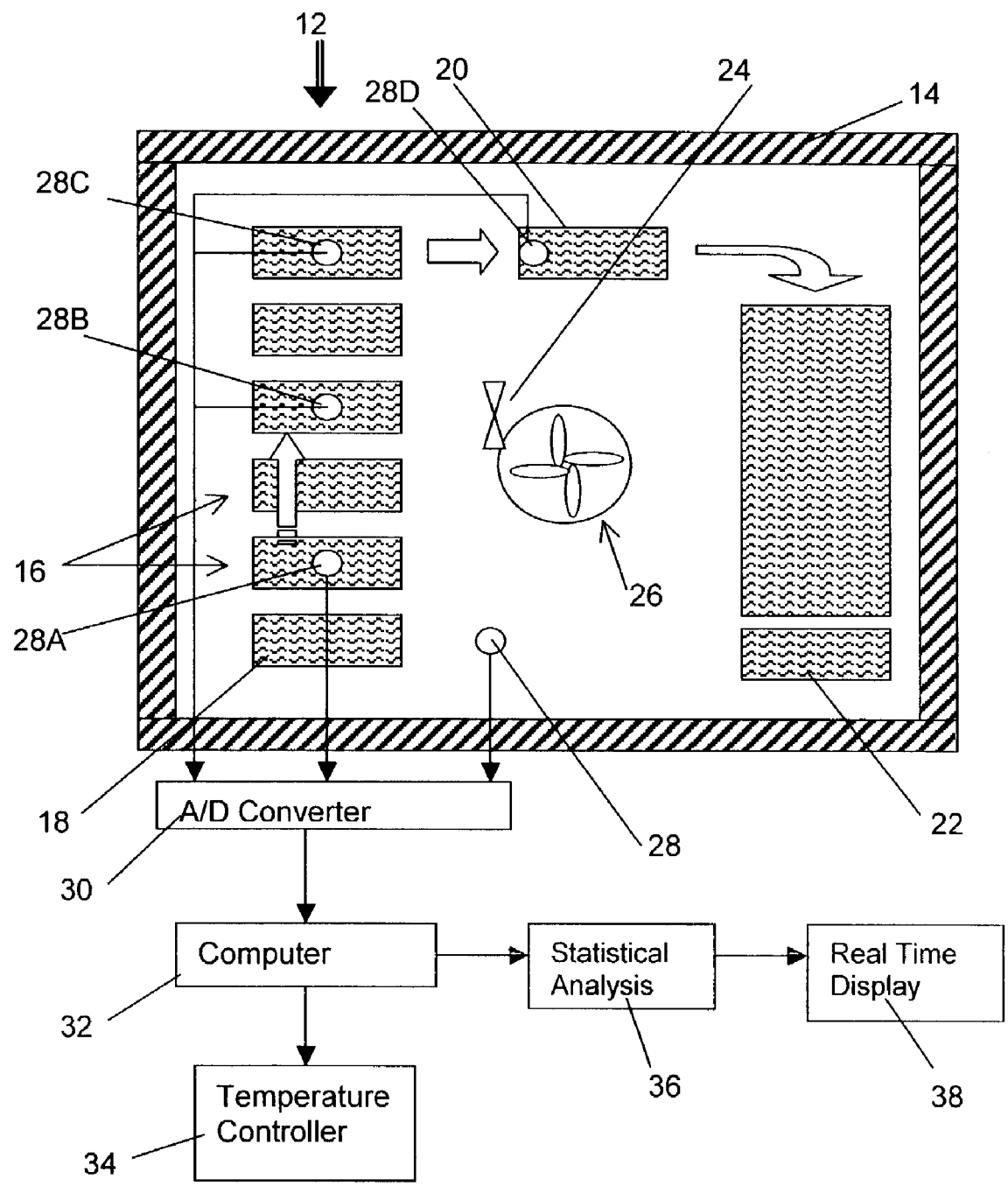
FIG. 2 is a schematic illustration of a test handler module according to the preferred embodiment of the invention.

FIG. 2 is a schematic illustration of a test handler module, including a preheat location 12 and test platform 20, according to the preferred embodiment of the invention. The test handler module has an outer wall and inner case 14. To transport test devices (not shown) around the inner case 14, a number of movable carriers 16 are integrated therein. Each carrier 16 preferably carries a test device, which may comprise a leadframe, Ball-Grid Array or other electronic package. In the preheat location 12 of the test handler module, there is an on-load position 18 where test devices are introduced into the inner case 14 and placed onto the carriers 16. The carriers 16 are then moved along heating chambers, which may be further divided into different temperature or heating zones, wherein heaters are positioned below the carriers 16. The heating chambers are designed such that the temperatures of the test devices are gradually raised to a predetermined temperature to prepare them for testing at the test platform 20. Interspersed within inner case are a number of radiation sensors, such as thermopile sensors 28, 28A–D, to measure temperatures of test devices that pass under the sensors.

After preheating in the preheat location 12, the carriers 16 are moved to the test platform 20 for electrical testing. After testing, the carriers 16 are transported towards the off-load location 22 for removal of the test devices from the test handler module. The inner case 14 may also include a liquid nitrogen control valve 24 and a cooling fan 26 that are controllable and adjusted as appropriate if say, the targeted device temperature in the system is below ambient temperature and cooling is required.

As the thermopile sensors 28, 28A–D detect radiation from the test devices, they produce an analog output, which corresponds to the temperature of the test devices sensed by the thermopile sensors 28, 28A–D. An Analogue-to-Digital converter 30 converts the output of the thermopile sensors 28, 28A–D from analogue to digital form. The Analogue-to-Digital converter 30 is electrically connected to a computer 32 and the digital output is received by the computer 32 for processing. A temperature control unit 34, which receives input from the computer 32, is in turn electrically connected to and controls a temperature controller, which controls heating/cooling parameters in the test handling module. Thus, the computer 32 may control factors such as a heating period of the test devices according to the soak time of the test devices desired and selected by a user, through the utilization of test device temperatures sensed by the thermopile sensors 28, 28A–D. The output from the computer 32 is applied to the temperature controller 34, which in turn operates the temperature controller according to the output from the computer 32 to make precise automatic temperature control possible.

Information from the computer 32 may optionally be further processed for statistical analysis 36. Statistical and other data may be displayed in real time 38 by output to the display screen 11 for viewing by a user. The parameters that may be displayed on display screen 11 include temperature, standard deviation and trend data.

Figure 3:
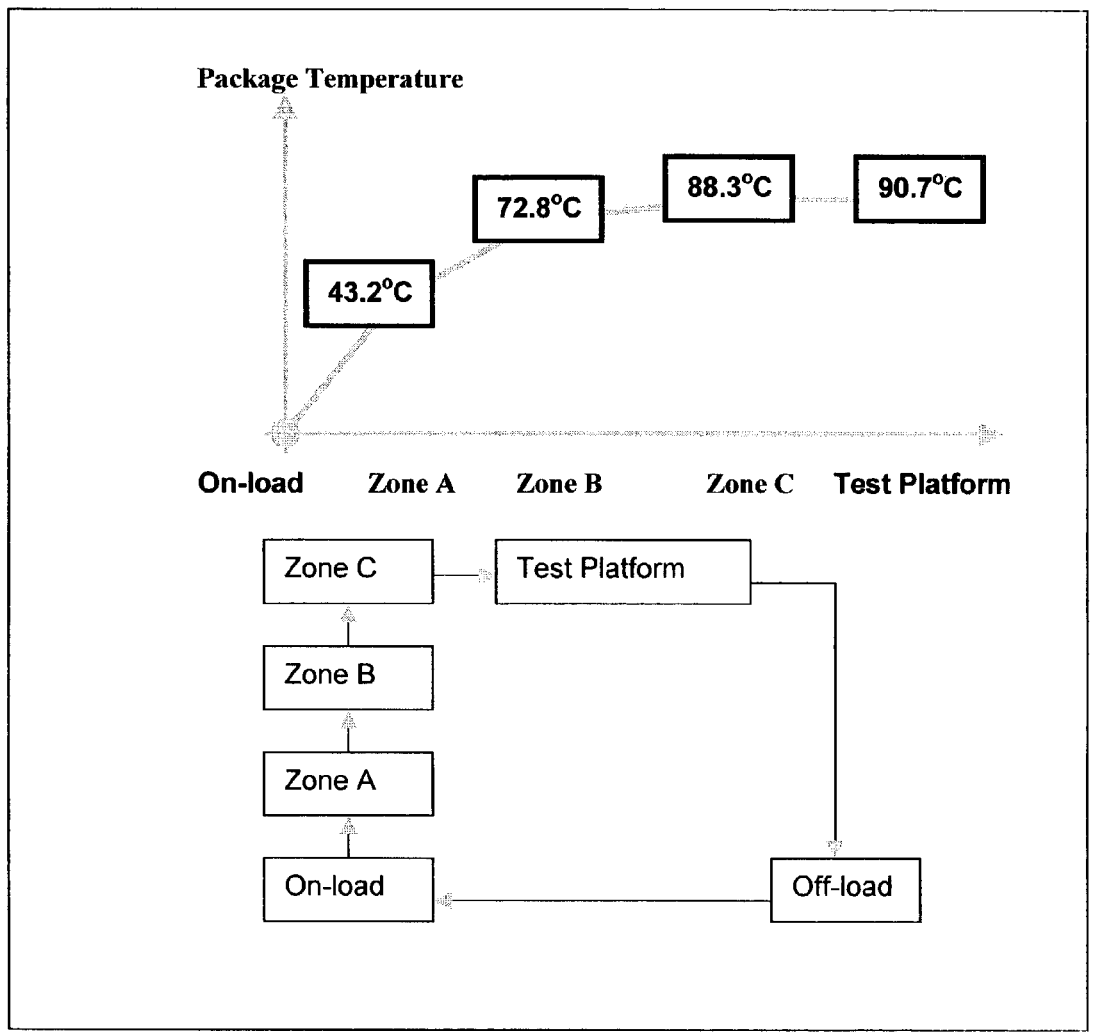
FIG. 3 is a graphical illustration of a typical heating sequence as a test device is prepared for testing at a test platform.

FIG. 3 is a graphical illustration of a typical heating sequence as a test device is prepared for testing at a test platform 20. A carrier 16 carrying a test device goes through the on-load position 18, different heating zones (Zones A–C), the test platform 20 and finally to the off-load position 22. Package temperatures of the test devices are monitored using thermopile sensors 28, 28A–D located in different zones of the heating chamber directly over the carriers 16 and devices to be tested. Reading FIG. 3 with FIG. 2, a first thermopile sensor 28 is located adjacent to the on-load position 18, a second thermopile sensor 28A is located at Zone A, a third thermopile sensor 28B is located at Zone B, a fourth thermopile sensor 28C is located at Zone C, and a fifth thermopile sensor 28D is located at the test platform 20. Information collected from the thermopile sensors 28, 28A–D may be compiled to form the graphical illustration of FIG. 3, which may be output to the display screen 11 for monitoring by a user.

FIG. 4 is an isometric view of a thermopile sensor 28 according to the preferred embodiment of the invention. The thermopile sensor 28 generally comprises a sensor cover 30, a sensor fixture 32, threaded nipples 34 conveying compressed dry air to and away from the sensor 28 and a cooling support 36.

FIG. 5 is a top view of the thermopile sensor 28 from direction C of FIG. 4. The threaded nipples 34 carry compressed air into and out of the thermopile sensor 28. The compressed dry air is meant to cool the thermopile sensor 28 to avoid thermal stress or other interference from the heating chambers of the preheating location 12.

FIG. 6 is a cross-sectional view of the thermopile sensor 28 along section A—A of FIG. 5. This view shows a thermopile device or integrated circuit ("IC") 38 positioned within the device. The thermopile IC 38 is attached to the sensor fixture 32 and is in contact with the cooling support 36. Air channels 42 in the cooling support 36 carry cooling compressed air to cool the thermopile sensor 28. Therefore, the cooling support 38 acts like a heat-sink to draw heat away from the thermopile IC 38. This helps to ensure that the thermopile sensor 28 is not subjected to temperature changes inside the heating chambers, thereby allowing more precise measurement by preserving the physical properties of the thermopile IC 38. Moreover, by reducing thermal stress or shock, the life of the thermopile sensor 28 can be extended as compared with traditional sensor devices, which are located inside the heating chambers and are subjected to thermal stresses.

The thermopile IC 38 includes a substrate having a membrane structure, a first insulation layer and a second insulation layer successively formed thereon. Two thermocouples formed on the second insulation layer are connected in series. Each thermocouple has a hot junction and a cold junction. The thermopile IC 38 further includes a temperature sensor formed at one side of the second insulation layer. The thermopile IC 38 further includes a third insulation layer and a black body formed on the third insulation layer over the hot junctions.

According to Wien's law, radiation intensity is proportional to the fourth power of the temperature of an object, and thus the radiation intensity increases sharply as surface temperature of the object rises. This property may be used to calculate surface temperature of an object, as employed in the preferred embodiment.

In order to allow radiation to reach the thermopile IC 38, a wave-guide 39 is formed in the cooling support 36. The wave-guide 39 preferably has a polished wall to reduce scattering of radiation waves before they reach the thermopile IC 38. Also illustrated in FIG. 6 are test devices in the form of IC package units 40 that are carried underneath the opening of the sensing wave-guide 39.

The thermopile sensor 28 provides for precise temperature conditioning or monitoring by sensing an amount of radiation energy emitted from a test device. Since IC packages are generally encapsulated using dark plastic molding, heat radiation properties of the body comprising plastic material can be taken advantage of. The thermopile sensor 28 senses the radiation temperature of the test device by utilizing a radiation rate difference between a black body and the dark body of the test device upon heating. Thus, the thermopile sensor generates a voltage corresponding to an infrared ray received through the wave-guide 39, which channels infrared ray produced by radiation from the test devices to the thermopile IC 38.

FIG. 7 is an exploded view of the thermopile sensor of FIG. 4. It shows, in sequence, the sensor cover 30, the sensor fixture 32, the thermopile IC 38, the threaded nipples 34 and cooling support 36. The cooling support 36 includes a wave-guide 39 dimensioned to allow insertion of the thermopile IC 38.

Figure 8:
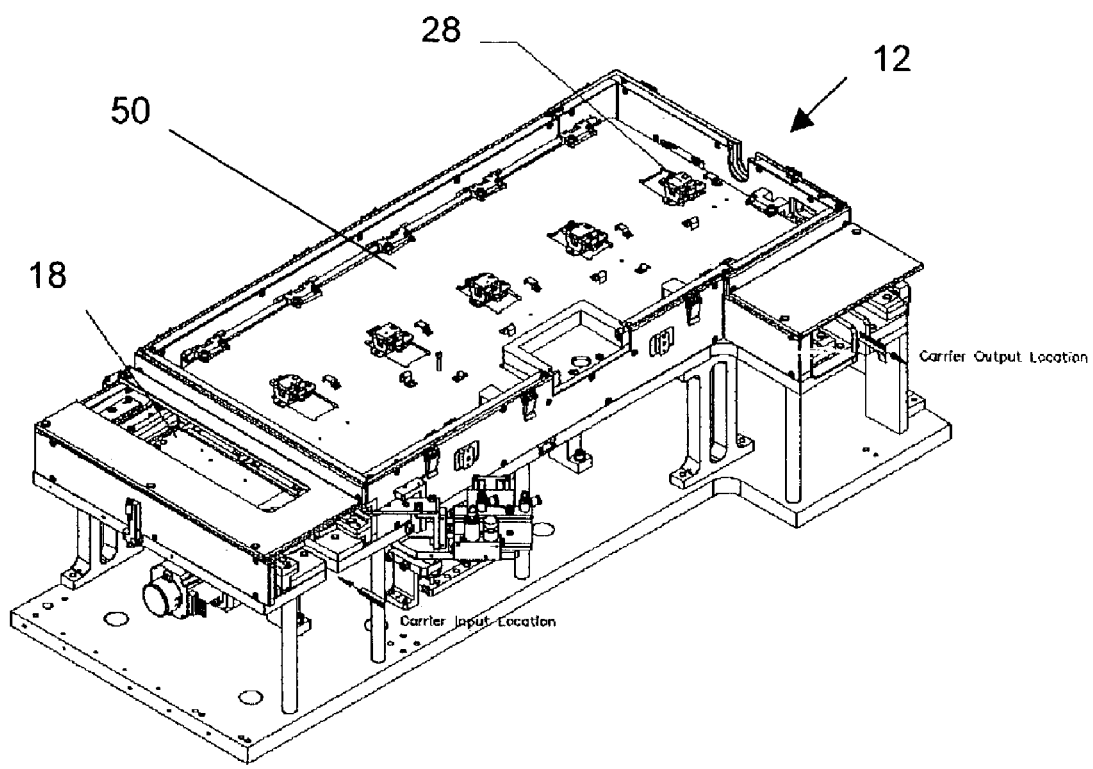
FIG. 8 is an isometric view of a preheat location of the test handler module according to the preferred embodiment of the invention.

FIG. 8 is an isometric view of a preheat location 12 of the test handler module according to the preferred embodiment of the invention. The preheat chambers are enclosed by a housing or an upper casing 50 as the carriers 16 are carried within the cavities of the chambers and are heated. Carriers 16 are introduced via an on-load position 18 and then moved into the preheat chambers underneath the upper casing 50. A number of thermopile sensors 28 are mounted on the housing or upper casing 50 over the heat chambers. It would be appreciated that the wave-guide 39 of the thermopile sensors 28 should extend through and be exposed on an underside of the preheat cover facing the test devices 40 of the carriers 16, so that radiation from the test devices may be received by the thermopile IC 38. After passing through the preheating zone, the carriers 16 are moved to the test platform (not shown in FIG. 8) for testing of the test devices.

It would be appreciated that the invention makes it possible to achieve contactless detection of surface temperatures of electronic devices during production. Instead of measuring temperatures of heat transfer media (eg. forced hot/cold air), true surface temperature is monitored inside the preheating and testing locations. Temperature data measured can be used for alarms, feedback control, or data analysis. Real-time temperature that can be displayed on a display screen allows a user to closely monitor the rate of temperature change of test devices. Data analysis can further include the correlation of yield loss and temperature profile or thermal instability.

The invention described herein is susceptible to variations, modifications and/or additions other than those specifically described and it is to be understood that the invention includes all such variations, modifications and/or additions which fall within the spirit and scope of the above description.

What is claimed is:

1. A test handler for testing a packaged electronic device comprising:
   a heat transfer location operative to bring a packaged electronic device to a desired test temperature,
   wherein the heat transfer location comprises:
   a plurality of successive heat transfer chambers;
   a plurality of heat transfer elements respectively disposed in the heat transfer chambers; and
   a computer operated controller for the heat transfer elements;
   a test platform constructed and configured to test the electronic device at said test temperature;
   at least one radiation sensor located at the heat transfer location adapted to detect the surface temperature of the packaged electronic device; and
   a temperature maintenance arrangement operative to maintain ensure that a sensing element in the radiation sensor is not subject to temperature changes without any substantial effect on the temperature of the test handler environment external to the radiation sensor.

2. A test handler according to claim 1, wherein the radiation sensor is located adjacent to the test platform.

3. A test handler according to claim 1, including a temperature controller that is responsive to signals received from the radiation sensor, whereby to regulate temperatures in the test handler.

4. A test handler according to claim 1, wherein:
   the electronic device has a surface formed of plastic material and
   the radiation sensor is positioned so its field of view is intercepted by the plastic surface.

5. A test handler according to claim 1, further including:
   a plurality of carriers operative to move packaged electronic devices through the heat transfer chambers to the test platform; and
   a plurality of radiation detectors located along the travel path of the carriers,
   the carriers being constructed and configured to bring the packaged electronic devices into thermal communication with the heat transfer elements and with the radiation detectors as they are moved through the heat transfer chambers by the carriers.

6. A test handler according to claim 1, wherein the radiation sensor comprises a thermopile device.

7. A test handler according to claim 6, wherein the thermopile device includes thermocouples connected in series, each with a hot junction and a cold junction.

8. A test handler according to claim 1, wherein the radiation sensor includes a wave-guide adjacent to its detecting surface that is adapted to define a transmission path for radiation from the electronic device to reach the radiation sensor.

9. A test handler according to claim 8, wherein the wave-guide has a polished wall to reduce scattering of radiation waves.

10. A test handler according to claim 1, wherein the heat transfer location comprises:
    a heat transfer chamber in communication with the test platform;
    a heat transfer element in the heat transfer chamber; and
    a computer operated controller for the heat transfer element.

11. A test handler according to claim 10, further including a carrier operative to move packaged electronic devices through the heat transfer chamber to the test platform, the carrier being constructed and configured to bring to packaged electronic devices into thermal communication with the heat transfer element and with the radiation detector as they are moved through the heat transfer chamber by the carrier.

12. A test handler according to claim 1, wherein the temperature maintenance arrangement provides a coolant to the radiation sensor.

13. A test handler according to claim 12, wherein the coolant is air.

14. A test handler according to claim 1, wherein the radiation sensor is attached to a support including the temperature maintenance arrangement.

15. A test handler according to claim 14, wherein the temperature maintenance arrangement comprises a coolant supply, coolant flow channels to conduct coolant to the radiation sensor; and a coolant recovery arrangement to conduct spent coolant away from the radiation sensor.

16. A test handler according to claim 15, wherein the coolant supply arrangement, the coolant flow channels, and the coolant recovery arrangement comprise a closed flow path which prevents loss of coolant into the environment around the radiation sensor.

17. A test handler according to claim 16, wherein the coolant is air.

18. A test handler according to claim 1, wherein the radiation sensor is positioned adjacent to the heat transfer location.

19. A test handler according to claim 18, wherein the radiation sensor is located over a path of travel of a electronic device between an onload position and the test platform.

20. A test handler according to claim 19, wherein the heat transfer location is operative to gradually change the temperature of the electronic device as it moves along the path of travel.

21. A test handler according to claim 20, including a plurality of radiation sensors positioned adjacent to the heat transfer location, wherein each radiation sensor is located at a different temperature zone at which a temperature of the electronic device is to be monitored.

22. A method for testing a packaged electronic device at a desired test temperature at a test platform in a test handler, the method comprising the steps of:
   bringing a packaged electronic device to a desired test temperature by:
      passing the packaged electronic device through a succession of heat transfer chambers having heat transfer elements therein;
      controlling the operation of the heat transfer elements by a computer operated controller;
      measuring radiation emitted by the packaged electronic device as it passes through each of the heat transfer chambers;
   controlling temperature at the heat transfer chambers using at least one radiation sensor to detect the surface temperature of the electronic device by measuring radiation emitted from the electronic device and providing information as to the detected temperature to the controller;
   testing the electronic device as said desired test temperature; and
   controlling a temperature of a sensing element in the radiation sensor to ensure that it is not subject to temperature changes without any substantial effect on the temperature of the test handler environment external to the radiation sensor.

23. A method according to claim 22, wherein the step of maintaining the radiation sensor at a desired temperature includes providing a supply of air to the radiation sensor through an air flow path.

24. A method according to claim 22, further including the step of locating the radiation sensor adjacent to a test platform on which a packaged electronic device is to be tested.

25. A method according to claim 22, wherein the electronic device is brought to the desired test temperature by a heat transfer arrangement and further including the step of locating the radiation sensor adjacent to the heat transfer arrangement.

26. A method according to claim 22, further including the step of regulating temperatures in the test handler with a temperature controller that is responsive to signals received from the radiation sensor.

27. A method according to claim 22, wherein:
   the electronic device has a surface formed of plastic material; and
   the radiation emitted from the plastic surface is measured.

28. A method according to claim 22, wherein the step of bringing the packaged electronic device to the desired test temperature comprises:
   passing the packaged electronic device through a heat transfer chamber having a heat transfer element therein;
   controlling the operation of the heat transfer element by a computer operated controller; and
   measuring radiation emitted by the packaged electronic device as it passes through the heat transfer chamber.

29. A method according to claim 22, wherein the step of maintaining the radiation sensor at a desired temperature includes providing a supply of coolant to the radiation sensor through a flow path.

30. A method according to claim 22, wherein the step of maintaining the radiation sensor at a desired temperature includes providing a supply of coolant to the radiation sensor through a closed flow path such that there is no loss of coolant into the environment around the radiation sensor.

31. A method according to claim 22, wherein the radiation sensor comprises a thermopile device.

32. A method according to claim 31, wherein the thermopile device includes thermocouples connected in series, each with a hot junction and a cold junction.

33. A method according to claim 22, wherein the radiation sensor is located over a path of travel of a electronic device between an onload position and a test platform.

34. A method according to claim 33, wherein the step of bringing the electronic device to the desired test temperature includes the step of gradually changing a temperature of the electronic device as it is moved along the path of travel.

35. A method according to claim 34, further including the step of locating a plurality of radiation sensors over the heat transfer location, wherein each radiation sensor is located at a different temperature zone at which a temperature of the electronic device is to be monitored.

* * * * *